United States Patent
Hughes (10) Patent No.: US 9,834,099 B2
(45) Date of Patent: Dec. 5, 2017

(54) CONTROL OF RECHARGEABLE ELECTRIC BATTERY SYSTEM FOR A VEHICLE

(71) Applicant: Jaguar Land Rover Limited, Coventry (GB)

(72) Inventor: Ian Hughes, Coventry (GB)

(73) Assignee: Jaguar Land Rover Limited, Whitley, Coventry (GB)

( * ) Notice: Subject to any disclaimer, the term of this patent is extended or adjusted under 35 U.S.C. 154(b) by 195 days.

(21) Appl. No.: 14/419,734

(22) PCT Filed: Aug. 6, 2013

(86) PCT No.: PCT/EP2013/066509
§ 371 (c)(1),
(2) Date: Feb. 5, 2015

(87) PCT Pub. No.: WO2014/023746
PCT Pub. Date: Feb. 13, 2014

(65) Prior Publication Data
US 2015/0165919 A1  Jun. 18, 2015

(30) Foreign Application Priority Data
Aug. 6, 2012 (GB) .................................. 1213919.2

(51) Int. Cl.
*H02J 7/00* (2006.01)
*H02J 7/14* (2006.01)
(Continued)

(52) U.S. Cl.
CPC ......... *B60L 11/1809* (2013.01); *B60L 11/187* (2013.01); *B60L 11/1857* (2013.01);
(Continued)

(58) Field of Classification Search
USPC ........ 320/134, 137, 150, 104, 136, 116, 135
See application file for complete search history.

(56) References Cited

U.S. PATENT DOCUMENTS

2007/0152640 A1    7/2007  Sasaki et al.
2008/0224709 A1*   9/2008  Tae .................... G01R 31/3662
                                                            324/430
(Continued)

FOREIGN PATENT DOCUMENTS

EP     1 806 248 A1      7/2007
JP     2003 297435 A    10/2003
WO     WO 2011/122946 A2  10/2011

OTHER PUBLICATIONS

International Search Report, PCT/EP2013/066509, dated Apr. 28, 2014, 3 pages.
(Continued)

*Primary Examiner* — Alexis Pacheco
(74) *Attorney, Agent, or Firm* — Myers Bigel, P.A.

(57) ABSTRACT

A control system for a vehicle for optimizing the energy efficiency of a rechargeable electric battery system and/or for optimizing the lifetime of a rechargeable electric battery. The rechargeable electric battery system comprising: the rechargeable electric battery, a temperature management system for the rechargeable electric battery and one or more sensors for measuring one or more characteristics relating to the rechargeable electric battery. The control system comprising a control unit configured and arranged to receive data from the one or more sensors and being coupled to the temperature management system. The control unit being configured and arranged to determine in dependence upon data received from the one or more sensors, a time-weighted-average state-of-health of the rechargeable electric battery. In dependence upon the determined time-weighted-average state-of-health of the rechargeable electric battery, the control unit is configured and arranged to manage the temperature management system and thereby manage the temperature of the rechargeable electric battery for optimiz-
(Continued)

ing the energy efficiency of the rechargeable electric battery system and/or for optimizing the lifetime of the rechargeable electric battery.

17 Claims, 5 Drawing Sheets

(51) Int. Cl.
*B60L 11/18* (2006.01)
*H01M 10/44* (2006.01)
*H01M 10/48* (2006.01)
*G01R 31/36* (2006.01)
*H01M 10/42* (2006.01)

(52) U.S. Cl.
CPC ...... *G01R 31/3679* (2013.01); *H01M 10/443* (2013.01); *H01M 10/486* (2013.01); *H02J 7/007* (2013.01); *G01R 31/3606* (2013.01); *G01R 31/3675* (2013.01); *H01M 2010/4271* (2013.01); *H01M 2220/20* (2013.01); *H02J 7/0014* (2013.01); *H02J 7/0047* (2013.01); *Y02T 10/7005* (2013.01); *Y02T 10/705* (2013.01)

(56) References Cited

U.S. PATENT DOCUMENTS

| | | |
|---|---|---|
| 2010/0000809 A1 | 1/2010 | Nishi et al. |
| 2010/0324765 A1 | 12/2010 | Iida et al. |
| 2012/0256569 A1* | 10/2012 | Kawahara ........... H01M 10/486 318/139 |

OTHER PUBLICATIONS

Combined Search and Examination Report, Application No. GB1213919.2, dated Nov. 30, 2012, 4 pages.

* cited by examiner

CONTROL OF RECHARGEABLE ELECTRIC BATTERY SYSTEM FOR A VEHICLE

RELATED APPLICATIONS

This application is a 35 U.S.C. §371 national stage application of PCT Application No. PCT/EP2013/066509, filed on Aug. 6, 2013, which claims priority from Great Britain Patent Application No. 1213919.2, filed on Aug. 6, 2012, the contents of which are incorporated herein by reference in their entireties. The above-referenced PCT International Application was published in the English language as International Publication No. WO 2014/023746 A2 on Feb. 13, 2014.

TECHNICAL FIELD

The present invention relates to a system for managing a rechargeable electric battery and particularly, but not exclusively, to a system for optimising the energy efficiency of the rechargeable electric battery and/or to optimising the lifetime of the rechargeable electric battery. The invention finds advantageous application in electric vehicles (EVs) and hybrid-electric vehicles (HEVs) where the rechargeable electric battery is used for propulsion of the vehicle and may be subject to varying environmental conditions and varying degrees of usage.

Aspects of the invention relate to a system, to a control unit, to a vehicle, to a program and to a method.

BACKGROUND

Rechargeable electric battery packs (also referred to herein simply as battery packs) typically comprise a series of sealed electrochemical energy storage cells. A rechargeable electric battery will degrade or deteriorate over time and with usage due to various factors including for example, the average voltage output energy throughput by the rechargeable electric battery, the temperature of the battery and state of charge.

US2011/0112781 to GM Global Technology discloses a method of gathering information from battery sensors, for instance, information regarding the state-of-charge (SOC); temperature; and/or other characteristics of a vehicle. The information is used to estimate or predict battery degradation or battery state-of-health (SOH). US2012/0078549 to Hyundai Motor Company discloses another method of estimating the state-of-health of a battery of a vehicle based upon measuring the temperature of the battery over time. A degree of deterioration of a battery is estimated from temperature change and travelling distance and the state-of-health of the battery. The remaining travelling distance of a vehicle comprising the battery is then said to be accurately estimated.

A rechargeable electric battery is an important component and the performance of a vehicle comprising such a battery may be determined by the quality of the rechargeable electric battery. Furthermore, a rechargeable electric battery is a high-cost component and the raw material used in the manufacture of the electrochemical storage cells (typically Lithium) can be costly to obtain and may be of limited supply. It is desirable to have rechargeable electric battery systems that are energy efficient. It is also desirable to maximise the length of time a rechargeable electric battery can be used (and/or to maximise the travelling distance that the rechargeable electric battery can provide). Indeed legislation, for example in the USA, is beginning to specify a minimum charging capacity that a rechargeable electric battery used in a vehicle must achieve after a period of use, for example 10 years.

The present invention seeks to provide an improvement in the field of rechargeable electric battery packs by providing a system for optimising the energy efficiency of the rechargeable electric battery and/or to optimising the lifetime of the rechargeable electric battery, that may be used in vehicles.

The invention may be utilised in applications other than for vehicles and passenger vehicles where rechargeable battery packs are used, for example, the rechargeable battery pack of the invention may find advantageous application in: commercial or utility vehicles, such as fork-lift-trucks; electricity grid storage; portable power generators; and back-up power supplies, for example in telecommunications applications.

SUMMARY

Aspects of the invention provide a system, a control unit, a vehicle, a program and a method as claimed in the appended claims.

According to one aspect of the invention for which protection is sought, there is provided a control system for a vehicle for optimising the energy efficiency and/or the lifetime of a rechargeable electric battery system comprising: a rechargeable electric battery, a temperature management system for the rechargeable electric battery and one or more sensors for measuring one or more characteristics relating to the rechargeable electric battery, the control system comprising a control unit configured and arranged to receive data from the one or more sensors and, in use, to the temperature management system, the control unit being configured and arranged to determine in dependence upon data received from the one or more sensors, a time-weighted-average state-of-health of the rechargeable electric battery and in dependence upon the determined time-weighted-average state-of-health of the rechargeable electric battery, the control unit is configured and arranged to manage the temperature management system and thereby manage the temperature of the rechargeable electric battery for optimising the energy efficiency of the rechargeable electric battery system and/or for optimising the lifetime of the rechargeable electric battery.

Optionally, the control unit is configured to determine a deviation of the determined time-weighted-average state-of-health of the rechargeable electric battery from an expected time-weighted-average state-of-health of the rechargeable electric battery.

Additionally, the expected time-weighted-average state-of-health of the rechargeable electric battery may be determined in dependence upon the age of the rechargeable electric battery and wherein said age is quantified in terms of time elapsed since first use of the rechargeable electric battery and/or in terms of distance traveled by a vehicle comprising the rechargeable electric battery.

Optionally, the control unit is configured to decrease the set-point temperature of the temperature management system if the determined time-weighted-average state-of-health indicates greater degradation of the rechargeable electric battery than is indicated by the expected time-weighted-average state-of-health. Advantageously in cooling the rechargeable electric battery the lifetime of the rechargeable electric battery may be extended or an expected lifetime may be achieved which otherwise may not have been if the overly degraded battery had been left to operate at a standard temperature set-point.

Optionally, the control unit is configured to increase the set-point temperature of the temperature management system if the determined time-weighted-average state-of-health indicates a lesser degree of degradation of the rechargeable electric battery compared to the expected time-average state-of-health. Advantageously, by doing so, the energy efficiency of the rechargeable electric battery system may be improved. The expected time-averaged state-of-health may be proportional to about a 2% decrease per year of the original state-of-health of the rechargeable electric battery. The original state-of-health of the rechargeable electric battery may be determined when the rechargeable electric battery is first used or within a set-time period from first use of the rechargeable electric battery.

The control system may be configured to determine that the state-of-health of the rechargeable electric battery is better or worse than expected for the age of the rechargeable electric battery (quantified in terms of time or in terms of distance traveled). Based upon that assessment, the control unit is configured to take action to either prolong the lifetime of the rechargeable electric battery by cooling the battery more than it has been, or to reduce the energy consumption of the rechargeable electric battery system by ceasing unnecessary overcooling of the battery. As such the control system is configured to react to the usage and environment of an individual battery in an individual vehicle that may be kept and driven in a very different climate and manner to another vehicle. This is in contrast to current control systems for rechargeable electric batteries in vehicles which are typically maintained at a set standard operating temperature during use that is fixed at vehicle manufacture and maintained constant throughout the battery's life.

According to one aspect of the invention for which protection is sought, there is provided a method of optimising the efficiency and/or the lifetime of a rechargeable electric battery system comprising a rechargeable electric battery, a temperature management system for the rechargeable electric battery and one or more sensors for measuring one or more characteristics relating to the rechargeable electric battery, the method comprising:
obtaining data from the one or more sensors;
determining in dependence upon said data a time-averaged state-of-health of the rechargeable electric battery;
controlling, in dependence upon the determined time-averaged state-of-health of the rechargeable electric battery, a required temperature of the rechargeable electric battery for optimising the efficiency and/or the lifetime of the rechargeable electric battery of the rechargeable electric battery system.

Within the scope of this application it is envisaged that the various aspects, embodiments, examples and alternatives, and in particular the individual features thereof, set out in the preceding paragraphs, in the claims and/or in the following description and drawings, may be taken independently or in any combination thereof. For example, features described in connection with one embodiment are applicable to all embodiments, unless such features are incompatible.

The methods, algorithms and control processes described herein can be machine-implemented. The methods, algorithms and control processes described herein can be implemented on one or more computational device(s) comprising one or more processors, for example, an electronic microprocessor. Such processor(s) may be configured to perform computational instructions stored in memory or in a storage device accessible by the processor(s).

As used herein the term state-of-health may be taken to mean any quantitative or qualitative assessment of the operating ability of a rechargeable electric battery which may include consideration of any one or a combination of the following non-limiting characteristics:
(i) the average operating temperature of all of the cells contained in the rechargeable electric battery;
(ii) the highest operating temperature of an individual cell contained in the rechargeable electric battery;
(iii) the lowest operating temperature of an individual cell contained in the rechargeable electric battery;
(iv) the difference between the highest operating temperature of an individual cell and the lowest operating temperature of an individual cell;
(v) the average state-of-charge of all of the cells contained in the rechargeable electric battery;
(vi) the highest state-of-charge of an individual cell contained in the rechargeable electric battery;
(vii) the lowest state-of-charge of an individual cell contained in the rechargeable electric battery;
(viii) the difference between the highest state-of-charge of an individual cell and the lowest state-of-charge of an individual cell;
(ix) the average voltage output of all of the cells contained in the rechargeable electric battery;
(x) the highest voltage output of an individual cell contained in the rechargeable electric battery;
(xi) the lowest voltage output of an individual cell contained in the rechargeable electric battery;
(xii) the difference between the highest voltage output of an individual cell and the lowest voltage output of an individual cell;
(xiii) the number of cells contained in the rechargeable electric battery;
(xiv) the number of chemically or physically degraded or failed cells in the rechargeable electric battery (including cells degraded due to different temperature zones in the vehicle effecting cell degradation locally and/or cells having a poor individual performance due to manufacturing tolerances); and
(xv) the ambient temperature about the vehicle and/or battery.

The term state-of-health has not been standardised within the domestic vehicle industry. If the term state-of-health comes to have a widely accepted meaning and/or is used to refer to an industry standard, it is to be understood that, as used herein the term state-of-health, may be the equivalent to any widely accepted meaning and/or industry standard but also may have a broader or more limited meaning compared to any widely accepted meaning and/or industry standard.

BRIEF DESCRIPTION OF THE DRAWINGS

Embodiments of the invention will now be described, by way of example only, with reference to the accompanying drawings, in which.

DETAILED DESCRIPTION OF EMBODIMENTS

Detailed descriptions of specific embodiments of the control system, method, vehicle and program of the present invention are disclosed herein. It will be understood that the disclosed embodiments are merely examples of the way in which certain aspects of the invention can be implemented and do not represent an exhaustive list of all of the ways the invention may be embodied. Indeed, it will be understood that the control system, method, vehicle and program described herein may be embodied in various and alternative forms. The figures are not necessarily to scale and some features may be exaggerated or minimised to show details of particular components. Well-known components, materials or methods are not necessarily described in great detail in order to avoid obscuring the present disclosure. Any specific structural and functional details disclosed herein are not to be interpreted as limiting, but merely as a basis for the claims and as a representative basis for teaching one skilled in the art to variously employ the invention.

It is known, for example from US2012/0078549 to Hyundai Motor Company, that a rechargeable electric battery pack that is subjected to a higher average battery pack temperature will have a shorter lifetime compared to an electric battery pack that is subjected to a lower average battery pack temperature. It is also known to cool a battery such that it always operates at a set temperature.

However, it has been realised by the inventor that the lifetime of a rechargeable electric battery pack can be improved or the energy economy of the rechargeable electric battery pack system can be improved by managing the time-weighted-average state-of-health of a battery pack.

For example, a battery pack in a vehicle disposed in a hot climate, for example, Arizona USA, may be at an ambient temperature when the vehicle is not in use that exceeds an optimum temperature of the battery pack. As such, only during the time that the vehicle is in use would the battery pack be cooled, by its own cooling system, to a temperature that is closer to or at an optimum temperature for the battery pack. In such circumstances the battery pack would likely degrade at a faster rate and the lifetime of the battery pack would likely be shortened because of the time the battery pack has spent at an elevated (non-optimum) ambient temperature. By monitoring the state-of-health and/or temperature of the battery pack over time, the control system of the present invention is able to identify that a battery pack may degrade more quickly than desired and is also configured to adjust the temperature management system to perform additional cooling of the battery pack during operation of the temperature management system. In this way the time-weighted-average state-of-health can be adjusted and improved and the rate of degradation of the battery pack modified to improve the longevity of the battery pack.

Figure 1:
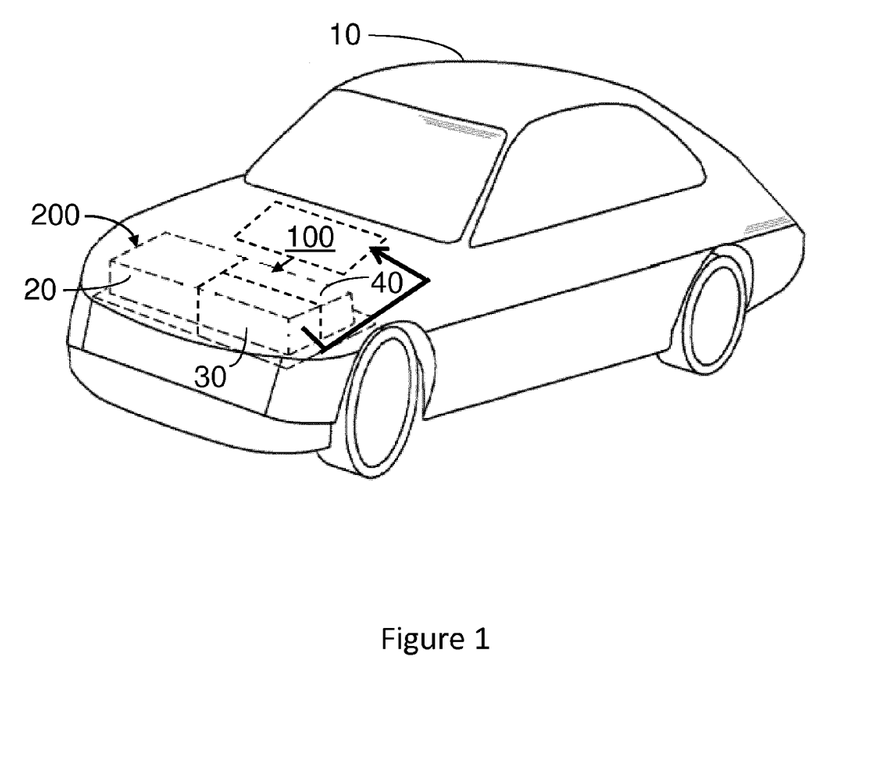
FIG. 1 is a perspective view of a vehicle comprising a rechargeable electric battery system and a control system therefor.

In FIG. 1 there is shown a perspective illustration of an electric vehicle 10 having a rechargeable electric battery system 200 and a control system 100 therefor.

Figure 2:
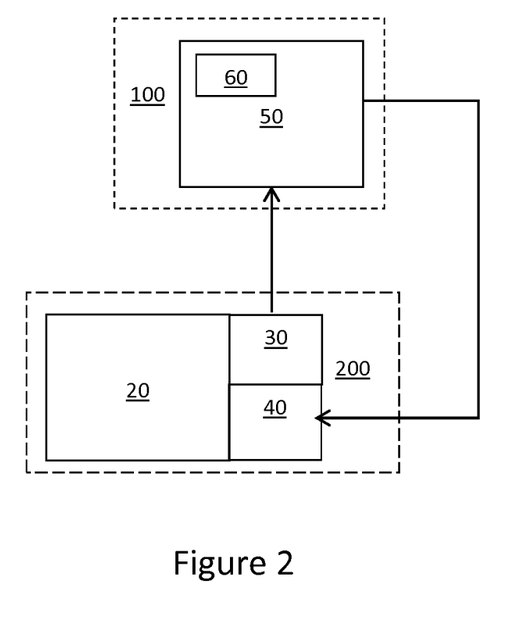
FIG. 2 is a schematic illustration of a control system for a rechargeable electric battery system for a vehicle according to an embodiment of the invention.

In FIG. 2 there is shown a schematic illustration of the control system 100 for the rechargeable electric battery system 200. The rechargeable electric battery system 200 comprises: a rechargeable electric battery 20, a temperature management system 40 for the rechargeable electric battery 20 and one or more sensors 30 for measuring one or more variables or characteristics relating to the rechargeable electric battery 20.

The rechargeable electric battery system 200 may additionally comprise a battery management system (BMS) not shown. The control unit 50 of the control system 100 (and optionally the entire control system 100) may be integrated within the battery management system (BMS). The BMS of the battery pack 20 may comprise additional components for example, electronic circuitry for managing, controlling and balancing the electric charge stored in and discharged from the individual cells of the battery pack 20. The BMS may be coupled to one or more of the one or more sensors 30.

Optionally, the battery pack 20 comprises a plurality of sealed rechargeable electrochemical energy storage cells (not shown). The rechargeable electrochemical energy storage cells may also be referred to herein as cells, pouches and cell pouches. Optionally, each cell may be a Li-ion (Lithium-ion) based electrochemical energy storage cell. In other envisaged embodiments alternative suitable electrochemical storage cells or combinations thereof may be used.

The temperature management system 40 is provided to adjust or control the temperature of the cells contained in the battery pack 20. The one or more sensors 30 may comprise temperature sensors (not shown) integrated into the battery pack 20. As such, at least part of the temperature management system 40 may be integrated within battery pack 20. The one or more sensors 30 may be coupled directly or indirectly to one or more of the cells of the battery pack 20 for measuring, for example: individual cell temperature; voltage; individual cell impedance; and individual cell state-of-charge (capacitance).

The control system 100 comprises a control unit 50 configured and arranged to receive data from the one or more sensors 30. The control unit 50 may be communicatively coupled to the one or more sensors 30. Information from one or more sensors 30 may be transmitted directly to the control unit 50 of the present invention from another vehicle control system having that data (for example, the battery management system) or information may be transmitted via an associated controller via a vehicle CAN-bus or similar vehicle-based data network. In this way the control system 100 is provided with measurements of one or more variables that are related to performance characteristics of the battery 20. The control unit 50 is coupled to the temperature management system 40 for controlling the cooling strategy implemented by the temperature management system 40.

The control unit 50 optionally comprises a processor and memory 60 and is configured and arranged to determine in dependence upon data received from the one or more sensors 30 a time-weighted-average state-of-health of the rechargeable electric battery 20. In dependence upon the determined time-weighted-average state-of-health of the rechargeable electric battery 20, the control unit 50 is configured and arranged to manage the cooling strategy performed by the temperature management system 40. Thereby the temperature of the rechargeable electric battery 20 is managed for optimising the energy efficiency of the rechargeable electric battery system and/or for optimising the lifetime of the rechargeable electric battery.

Figure 3:
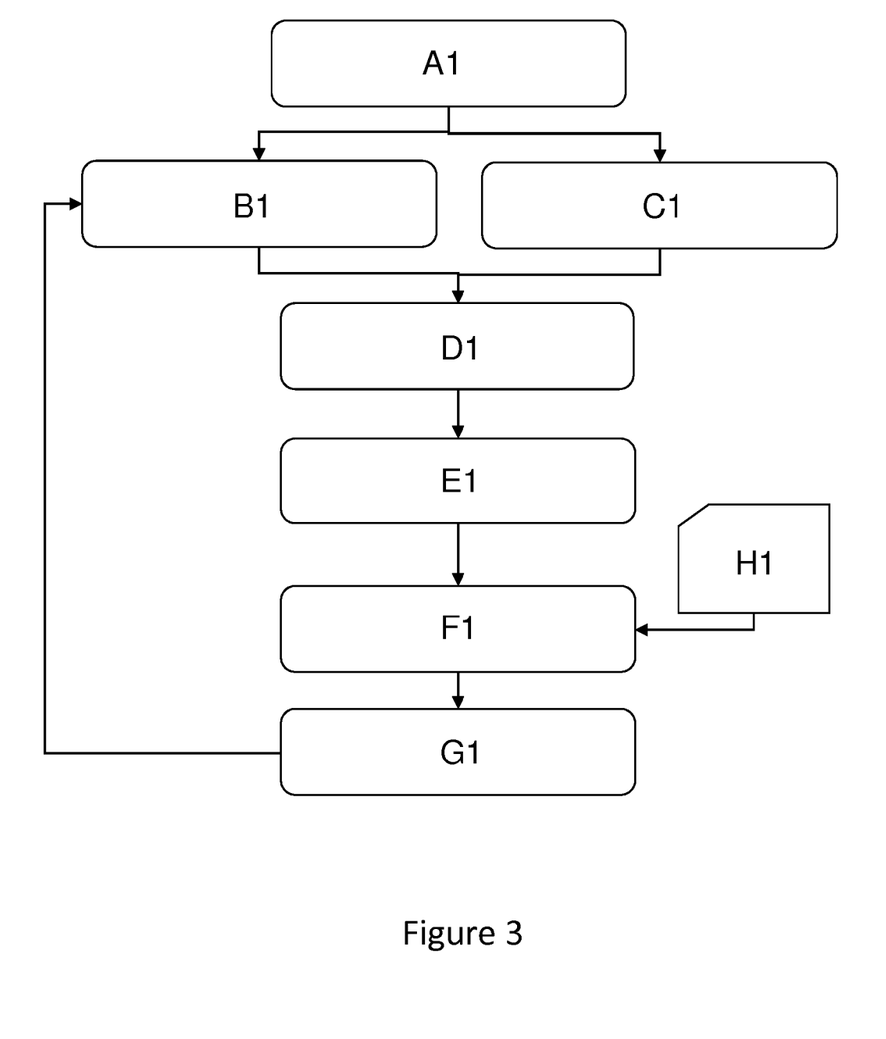
FIG. 3 is a schematic illustration or flow diagram illustrating at least in part an algorithm carried out by the control system according to an embodiment of the invention.

In FIG. 3, an algorithm or method that may be carried out by the processor and memory 60 of the control unit 50 in an embodiment of the invention is shown schematically. The control unit 50 is provided with a temperature control strategy A1. Optionally this may include one or more different set-point temperatures for the temperature management system to be used for specified periods of time during specified circumstances.

In the optional embodiment illustrated schematically in FIG. 3, the control unit 50 is configured to run an algorithm described as follows:

A1: Control unit 50 uses an initial cooling strategy for the temperature management system 40.

B1: The control unit determines a quantified state-of-health (also referred to as SoH score) of the battery pack 20;

C1: The control unit 50 measures the time (t) at which the state-of-health was determined at B1;

D1: The control unit 50 stores the state-of-health score at the time taken (SoH (t));

E1: After a period of time (P) the control unit 50 determines a time-weighted-average state-of-health (SoH(t)) based upon the state-of-health scores;

F1: The control unit 50 determines a cooling strategy dependent upon the time-weighted-average state-of-health;

H1: Optionally, the control unit 50 references a look-up table of stored values of state-of-health for the age of the battery pack and compares the determined time-weighted-average state-of-health to an expected or optimum state-of-health for the age of the battery pack and based upon the difference between the two values, the control unit 50 references, in a look-up table, parameters for a cooling strategy; and G1: The control unit 50 instructs the temperature management system 40 how to perform the required cooling strategy.

In the algorithm being described with reference to FIG. 3, the control strategy includes a variety of temperature set points, for a specified range of circumstances. The temperature management strategy includes five vehicle scenarios and in dependence upon the relative degradation of the vehicle (quantified by the measured state-of-health) a different temperature management strategy will be selected. For example, a first scenario is the temperature set point of the temperature management system 40 during vehicle use; a second scenario is the temperature set point of the temperature management system 40 during charging of the battery pack; a third scenario is the additional time during which battery pack cooling is set to continue after the battery pack is no longer in use; in a fourth scenario during a period of non-use of the battery pack, for example when the vehicle user is on holiday away from the vehicle, the temperature management system is configured to operate to maintain a particular temperature for a particular time period.

A set of scenarios and set points for four temperature management strategies are given below.

It will be recognised that many and various strategies may be used and that those listed below are merely illustrative and to aid the description of the invention.

It will be understood that the selection of a particular strategy will depend upon battery pack performance, in other words dependent upon time-weighted-average state-of-health.

For example, strategy 1 may be adopted when the vehicle battery pack 20 time-weighted-average state-of-health score is as good as or better than expected for the age of the battery pack 20. Such a scenario may occur when a vehicle 10 is kept in an environment having a moderate or cool climate, wherein the ambient temperature is similar to the preferred temperature of the battery pack 20. In such a scenario, during operation of the battery pack 20, cooling of the battery pack 20 below the ambient temperature may be unnecessary; (for example, it would not result in an advantage and may only extend the battery lifetime beyond a required lifetime), yet electrical energy to power a cooling system would be used. This unnecessary energy consumption may be avoided by adapting strategy 1 in which the temperature set point during battery operation (voltage supply) and battery charging is increased, for example to 35° C. from for example 30° C.

Optionally, whereas the dynamic temperature control permits the control unit 50 to select perhaps a higher than typical battery pack 20 temperature; the temperature management system 40 would nevertheless be provided with a maximum temperature threshold for a battery pack 20. The maximum temperature threshold may be measured against either average temperature of all of the cells in the battery pack 20 or by any one individual cell. If the maximum temperature threshold is reached an automatic cooling of the battery pack 20 would be invoked irrespective of the adopted temperature management strategy.

Temperature management strategy 2 may be adopted by the temperature management system 40 (under instruction from the control system 100), where the battery pack has degraded to some extent but not to the degree expected for its age. A metric for degradation is that a 2% reduction in state-of-health per year is acceptable. With such a rate of degradation, after a 10 year battery pack lifetime, the battery pack still would operate at 80% of its original capacity. It will be appreciated that for different types and size of battery pack 20 an acceptable lifetime may be different and indeed battery lifetime may be quantified by an alternative metric and may not be quantified as a battery having 80% of the battery's original (charging) capacity at the end of a 10 year period.

| | Temperature Management Strategy No. | | | |
|---|---|---|---|---|
| Temp. Set Point Description | 1 | 2 | 3 | 4 |
| Cooling set point to be used whilst vehicle is being used (i.e. vehicle being driven or switched on) | 35° C. | 35° C. | 30° C. | 20° C. |
| temperature set point during charging of rechargeable electric battery | 35° C. | 30° C. | 25° C. | 20° C. |
| Run-on time of the temperature management system | None | None | 10 mins | 30 mins |
| Number of days during a non-vehicle use period (for example a user's holiday) that temperature management system should be on | None | None | 2 | 20 |
| Temperature set point during a non-vehicle use period | N/A | N/A | 30° C. | 25° C. |

In the algorithm being described with reference to FIG. 3, the state-of-health score is calculated from the following measured characteristics:

(i) the average operating temperature of all of the cells contained in the rechargeable electric battery pack (referred to simply as Pack Temperature); and (ii) the average state-of-charge of all of the cells contained in the rechargeable electric battery pack (referred to simply as Pack Charge).

Based upon the measured Pack Temperature and Pack Charge a state-of-health or health score is determined (B1). The determined score is recorded and the time at which it was determined is taken (D1). The control unit 50 records this data over a period of time and from the recorded data is able to determine a time-weighted-average state-of-health score (E1).

For example the state-of-health score may be determined on a daily basis. The time period (P) that the state-of-health score is recorded for maybe one month, two months or for example one year (i.e. 365 days). The time-weighted-average state of health score is therefore calculated at the end of the time period (P). Because a time-weighted-average is calculated, consideration is given to the percentage of time (e.g., days) out of that time period (P) that a particular state-of-health score was determined. It will be understood therefore, that using the state-of-health score of the present embodiment for a vehicle 10 in a climate having a high ambient temperature, that was driven only one hour per week and whose battery was re-charged only once per month, the time-averaged state-of-health score of the battery pack will differ from the state-of-health score of a battery in a vehicle 10 kept in the same climate but driven for three hours per day (and hence cooled to a lower than ambient temperature for three hours per day) and recharged daily (and hence having a higher average state-of-charge). Based upon an individual battery's 20 usage, ambient climate and re-charging conditions, its time-weighted-average state-of-health determined by the control unit 50 will differ. Based upon the time-weighted-average state-of-health, a temperature management strategy is selected by the control unit 50 (optionally by referencing a look-up table).

For a battery pack 20 having a lower time-weighted-average state-of-health score after the measurement period (P), a cooling strategy is selected by the control unit 50 to mitigate against the effects that caused the low time-weighted-average state-of-health score. For example, the battery pack 20 of the vehicle 10 that was used for only one hour per week may be subject to additional cooling when the vehicle 10 is not in use (as per, for example, the third strategy listed above). (It will be recognised that depending upon the mathematical combination of the measured data used to determine a state-of-health, that in other embodiments a high health score may in fact be indicative of degradation and the exact scale used to quantify the state-of-health of a battery pack 20 may differ from that described here.)

Optionally the control unit 50 is configured automatically to effect such "non-vehicle-use" cooling. Alternatively a control panel within the vehicle's 10 cabin may issue a notice to a user of the vehicle 10 requesting the user to activate or agree to the "over cooling". The control unit 50 may be configured to automatically effect the additional temperature management of the battery pack 20 when the vehicle 10 is not in use. In this way, if the usage of the vehicle 10 in the next successive time period (P) (for example year two) remains the same (for example, vehicle in climate with high ambient temperature; driven one hour per week and re-charged once per month), the time-weighted-average state-of-health of the battery pack 20 at the end of the second time period may be significantly improved compared to what it would otherwise have been. The control unit 50, upon determining the time-weighted-average state-of-health score for the second time period (E1) will then determine a required battery cooling strategy (F1). Optionally, the cooling strategies may be recorded in a look-up table, optionally stored in the memory 60 of the control system 100. In dependence upon the time-weighted-average state-of-health score for the second period (P), the battery cooling strategy may stay the same; revert to the original cooling strategy; or change to a different strategy to implement even further over-cooling. In some envisaged embodiments, in determining which temperature management strategy to adopt, the control system 100 is configured to take into consideration the preceding temperature management strategies that have been employed.

In envisaged embodiments, the control unit 50, upon determining a time-weighted-average state-of-health score, is configured to change the time period (P) in which the next successive time-weighted-average state-of-health score should be determined. In this way a battery pack 20 whose health is degrading more rapidly than is considered to be acceptable can be subjected to more frequent management by the control system 100. For example, the time period (P) may be reduced from annually to bi-annually or from monthly to weekly.

It will be recognised that whereas a period of 365 days has been suggested for the time period (P) that in other embodiments it is envisaged that a shorter or longer time period (P) may be used. For example, the time-weighted-average state-of-health may be determined about or exactly at: weekly, monthly, bi-monthly, tri-monthly, bi-annually or annually. Additionally or alternatively, in other envisaged embodiments, the time-weighted state-of-health score may be determined in dependence upon the distance traveled by the vehicle.

Figure 4:
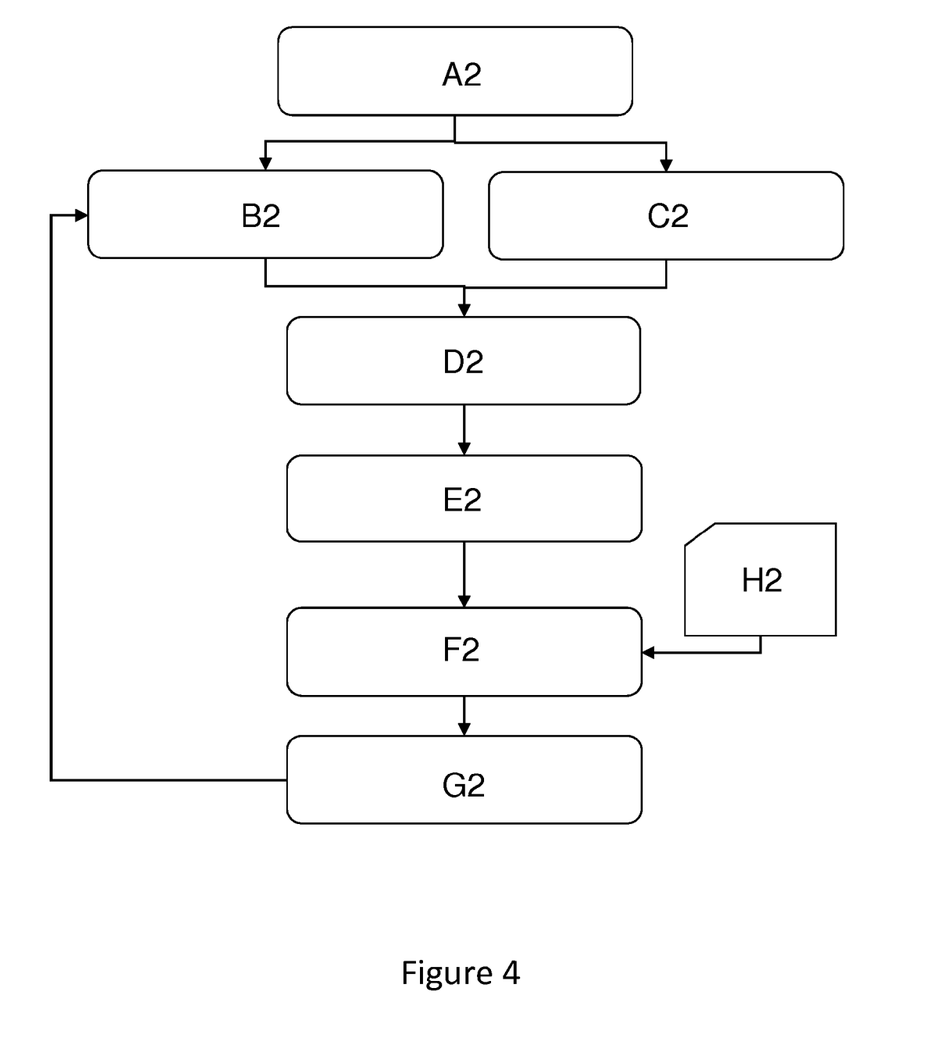
FIG. 4 is a schematic illustration or flow diagram illustrating at least in part an algorithm carried out by the control system according to another embodiment of the invention.

In another envisaged embodiment, the control system 100 is configured to execute a different algorithm. This is illustrated, at least in part, schematically in FIG. 4. In this embodiment the temperature management strategy (A2) comprises selection of only different set-point temperatures (in dependence upon the time-weighted-average state-of-health score determined after a time period (P)). No cooling during holiday periods or non-vehicle use periods or run-on time management is performed. More simply at a time period (P) a time-weighted-average state-of-health score is determined (E2), based upon the recorded state-of-health score (B2, D2, C2). In this embodiment the state-of-health score is optionally determined based upon the following three factors:

(i) the average temperature of all of the cells contained in the rechargeable electric battery pack (also referred to as Pack Temperature);

(ii) the average voltage output of all the cells contained in the rechargeable electric battery (also referred to simply as Pack Voltage); and (iii) the average state-of-charge of all of the cells contained in the rechargeable electric battery pack (also referred to simply as Pack Charge).

Optionally, the state-of-health-score may be determined from the above characteristics by first scoring each characteristic. The individual characteristic scores may then be summed, averaged or otherwise mathematically combined to create an overall state-of-health-score. Optionally the control unit 50 may refer to a look-up table such as that set out below to determine the required temperature set point to be used by the temperature management system 40. The temperature set points are preferably listed against values (or ranges) of rate of battery health degradation. The determined time-weighted-average state-of-health degradation rate is optionally calculated relative to the originally determined state-of-health of the battery at a given time period, for example at manufacture.

In this embodiment the determined state-of-health is compared to an expected or required state-of-health for the age of the battery pack 20. For example, for a 10 year battery life time, an acceptable rate of state-of-health degradation may be about −2% per year. This optional bench mark (−2% degradation in SoH per year) is used in the present embodiment to determine the cooling set-point that the control unit 50 should instruct the temperature management system 40 to maintain the battery pack 20 at (during use of the vehicle 10). The control unit 50 may reference a look-up table such as the following:

| Rate of SoH Degradation | Temperature Set Point |
|---|---|
| 0% | Not Applicable (DEFAULT Temp) |
| −1% | about 35° C. |
| −2% | about 30° C. |
| −3% | about 27° C. |
| −4% | about 25° C. |

It will be recognised that the mathematical manipulations referred to herein may be variously altered, reconfigured, changed and adapted in generating algorithms and programs for a control system 100 according to the invention described. Specifically, determining a state-of-health score or otherwise quantifying the state-of-health of a battery pack 20 may be achieved in many and various suitable ways and using one or more of a variety of battery pack 20 characteristics.

It will be recognised that any data values from the one or more sensors 30 may be rounded and/or averaged. It will be recognised that in computing any metric, for example state-of-health (score) and time-weighted-average state-of-health (score) that computed values may be rounded.

It will be recognised that where a look-up table is used by the control unit 50 in referencing a temperature management strategy, the look-up table may be stored remotely and/or locally. The look-up table may be updateable, for example during servicing of the vehicle 10 an update may be installed.

Alternatively or additionally, the control unit 50 may be configured to compute a desired temperature management strategy or compute at least part of the temperature management strategy based on an algorithm pre-programmed into the control unit 50.

Figure 5:
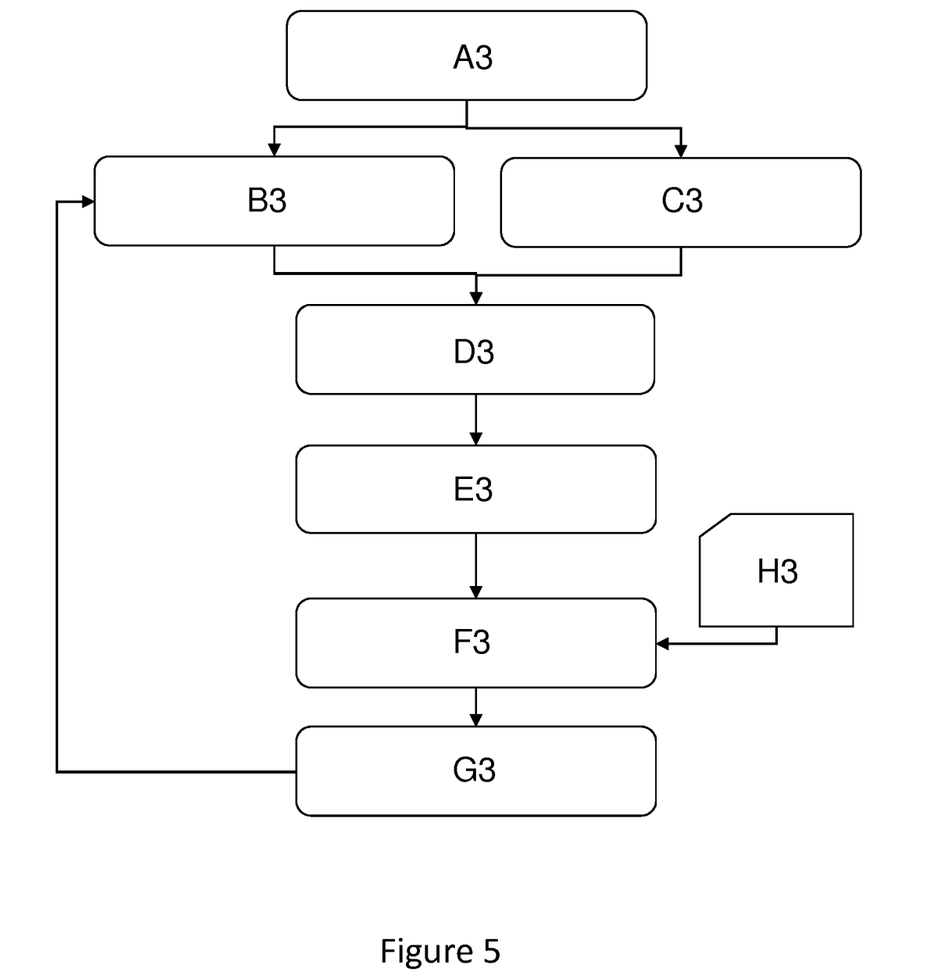
FIG. 5 is a schematic illustration or flow diagram illustrating at least in part an algorithm carried out by the control system according to yet another embodiment of the invention.

In one embodiment of the invention, the state-of-health of the battery pack 20 is determined solely in dependence upon a time-weighted-average temperature of the battery pack 20. FIG. 5 shows schematically at least part of an algorithm or method that may be carried out by the processor and memory 60 of the control unit 50 in another embodiment of the invention. An initial temperature set point (A3) is provided for the temperature management system 40.

The temperature of the battery pack 20 is measured (B3). This may be achieved by the BMS monitoring data from thermistors coupled to each individual cell of the battery pack 20, periodically, for a given time period (for example one day). The BMS may then issue to the control unit 50, an average battery pack temperature for that day. The control unit 50 records the time of the measurement (C3), for example day-one, and the Pack Temperature. Based upon a collated data set of temperature over time (D3), the control unit 50 is configured to compute a time-weighted-average state-of-health (E3). In this embodiment the time-weighted-average state-of-health is equivalent to a time-weighted-average battery pack temperature. In dependence upon this time-weighted-average battery pack 20 temperature, a temperature set point for the temperature management system 40 is determined by the control unit 50 (F3). Optionally the control unit 50 may compute the temperature set point and/or may reference a look-up table (H3). The control unit 50 then may issue a revised temperature set point to the temperature management system (G3) for the coming time period (P).

The control system 100 continues to monitor the health of the battery pack 20 and adopt an appropriate temperature management strategy either to optimise the energy efficiency or to improve the battery life time.

It will be recognised that vehicles 10 can be transferred to different climates and that climates change. Furthermore subject to vehicle 10 usage and care the battery pack 20 health may change. It is envisaged therefore that during a battery pack 20 lifetime different temperature management strategies may be employed and during one period this may be to optimise energy efficiency and during another (preceding or succeeding) period the strategy may be to optimise battery lifetime.

In other embodiments the one or more sensors 30 are contained in other control systems of the vehicle for example, but not limited to a temperature sensor to monitor the ambient temperature of the vehicle 10.

Whereas the term cooling system 40 has been used herein this should be taken as being synonymous with temperature management system 40. The temperature management system 40 may be configured to heat and/or cool a battery pack.

The invention claimed is:

1. A control system for a rechargeable electric battery system for a vehicle, the rechargeable electric battery system comprising:
    a rechargeable electric battery;
    a temperature management system for the rechargeable electric battery; and
    one or more sensors for measuring one or more characteristics relating to the rechargeable electric battery,
    the control system comprising a control unit being coupleable to the temperature management system and being arranged to:
        receive data from at least one of the one or more sensors;
        determine a time-averaged state-of-health of the rechargeable electric battery in dependence upon the received data; and
        manage the temperature management system in dependence upon the determined time-averaged state-of-health of the rechargeable electric battery, wherein the control unit is configured to determine a deviation of the time-averaged state-of-health of the rechargeable electric battery from an expected time-averaged state-of-health of the rechargeable electric battery.

2. The control system according to claim 1, wherein the expected time-averaged state-of-health of the rechargeable electric battery is determined in dependence upon an age of the rechargeable electric battery, and wherein said age is quantified in terms of time elapsed since first use of the rechargeable electric battery and/or in terms of distance traveled by the vehicle.

3. The control system according to claim 1, wherein the control unit is configured to decrease a set-point temperature of the temperature management system if the time-averaged state-of-health indicates greater degradation of the rechargeable electric battery than is indicated by the expected time-averaged state-of-health for optimising the lifetime of the rechargeable electric battery.

4. The control system according to claim 1, wherein the control unit is configured to increase a set-point temperature of the temperature management system if the time-averaged state-of-health indicates lesser degradation of the rechargeable electric battery than is indicated by the expected time-averaged state-of-health for optimising the efficiency of the rechargeable electric battery system.

5. The control system according to claim 1, wherein the expected time-averaged state-of-health change over a year is proportional to an original state-of-health of the rechargeable electric battery.

6. The control system according to claim 5, wherein the original state-of-health of the rechargeable electric battery is determined when the rechargeable electric battery is first used or within a set-time period from first use of the rechargeable electric battery.

7. The control system according to claim 5, wherein the expected time-averaged state-of-health change over a year is about 2% of the original state-of-health of the rechargeable electric battery.

8. The control system according to claim 1, wherein said one or more characteristics relating to the rechargeable electric battery includes any one or more or a combination of:
   (i) an average temperature of all cells contained in the rechargeable electric battery;
   (ii) a highest temperature of an individual cell contained in the rechargeable electric battery;
   (iii) a lowest temperature of an individual cell contained in the rechargeable electric battery;
   (iv) a difference between a highest temperature of an individual cell and a lowest temperature of an individual cell;
   (v) an average state-of-charge of all cells contained in the rechargeable electric battery;
   (vi) a highest state-of-charge of an individual cell contained in the rechargeable electric battery;
   (vii) a lowest state-of-charge of an individual cell contained in the rechargeable electric battery;
   (viii) a difference between a highest state-of-charge of an individual cell and a lowest state-of-charge of an individual cell;
   (ix) an average voltage output of all cells contained in the rechargeable electric battery;
   (x) a highest voltage output of an individual cell contained in the rechargeable electric battery;
   (xi) a lowest voltage output of an individual cell contained in the rechargeable electric battery;
   (xii) a difference between a highest voltage output of an individual cell and a lowest voltage output of an individual cell;
   (xiii) a number of cells contained in the rechargeable electric battery; and
   (xiv) a number of chemically or physically degraded or failed cells in the rechargeable electric battery.

9. The control system according to claim 1, comprising one or more auxiliary sensors coupled to the control unit and capable of issuing data to the control unit relating to one or more characteristics of an environment about the vehicle.

10. The control system according to claim 3, comprising an auxiliary sensor for measuring ambient temperature of an environment about the vehicle.

11. The control system according to claim 1, wherein the control unit is configured to manage the temperature management system by determining any one or more or a combination of the following parameters:
   (i) temperature set point when the vehicle is being driven and/or the vehicle is switched on;
   (ii) temperature set point during charging of the rechargeable electric battery;
   (iii) run-on time of the temperature management system;
   (iv) temperature set point during a non-vehicle use period; and
   (v) strategy or mode during a non-vehicle use period.

12. The control system according to claim 1, wherein any of the one or more sensors provides real-time data to the control unit or wherein any of the one or more sensors provides time-averaged data to the control unit.

13. The control system according to claim 1, wherein the time-averaged state-of-health of the rechargeable battery is determined about weekly, about monthly, about bi-monthly, about tri-monthly, about every 100 miles traveled, about every 500 miles traveled or about every 1000 miles traveled.

14. A method of controlling a rechargeable electric battery system comprising a rechargeable electric battery, a temperature management system for the rechargeable electric battery and one or more sensors for measuring one or more characteristics relating to the rechargeable electric battery, the method comprising:
   obtaining data from at least one of the one or more sensors;
   determining a time-averaged state-of-health of the rechargeable electric battery in dependence upon said data;
   controlling a required temperature of the rechargeable electric battery in dependence upon the time-averaged state-of-health of the rechargeable electric battery; and
   determining a deviation of the determined time-averaged state-of-health of the rechargeable electric battery from an expected time-averaged state-of-health of the rechargeable electric battery.

15. A vehicle comprising a rechargeable electric battery system and a control system therefor according to claim 1.

16. A vehicle comprising a rechargeable electric battery system and configured to carry out the method of claim 14.

17. A program for a control unit for use in a control system according to claim 1 and/or configured to carry out at least part of the method of claim 14 when in use.

* * * * *